(12) United States Patent
Hill et al.

(10) Patent No.: US 6,849,941 B1
(45) Date of Patent: Feb. 1, 2005

(54) HEAT SINK AND HEAT SPREADER ASSEMBLY

(75) Inventors: Richard Hill, Parkman, OH (US); Jason Strader, North Olmstead, OH (US)

(73) Assignee: Thermagon, Inc., Cleveland, OH (US)

( * ) Notice: Subject to any disclaimer, the term of this patent is extended or adjusted under 35 U.S.C. 154(b) by 0 days.

(21) Appl. No.: 10/752,612

(22) Filed: Jan. 7, 2004

(51) Int. Cl.[7] .............................................. H01L 23/34
(52) U.S. Cl. ..................... 257/710; 257/711; 257/702; 257/703; 257/705; 257/706; 257/707; 361/709
(58) Field of Search ................................. 257/710, 711, 257/700, 702, 703, 705, 706, 707; 361/709

(56) References Cited

U.S. PATENT DOCUMENTS

| | | | | |
|---|---|---|---|---|
| 4,630,096 A | * | 12/1986 | Drye et al. ................. | 257/777 |
| 4,663,649 A | * | 5/1987 | Suzuki et al. ............... | 257/746 |
| 4,876,588 A | * | 10/1989 | Miyamoto ................... | 257/706 |
| 5,338,971 A | * | 8/1994 | Casati et al. ................ | 257/666 |
| 6,078,491 A | * | 6/2000 | Kern et al. ................. | 361/167 |
| 6,084,775 A | * | 7/2000 | Bartley et al. .............. | 361/705 |
| 6,731,011 B2 | * | 5/2004 | Verma et al. ............... | 257/777 |
| 2003/0114022 A1 | * | 6/2003 | Franzen et al. .............. | 439/67 |

* cited by examiner

*Primary Examiner*—Jasmine Clark
(74) *Attorney, Agent, or Firm*—Anderson, Kill & Olick, P.C.; Eugene Lieberstein; Michael N. Meller

(57) ABSTRACT

A heat sink and heat spreader assembly including a solid member of a conductive material and a layer of a low melting alloy having phase change properties bonded to at least one surface of the solid member such that a welded joint is formed there between possessing a thickness of from 0.0001 to 0.020 inches and having a composition consisting essentially of said low melting alloy with the welded joint having an exposed relatively flat surface suitable for direct attachment to an electronic heat source or heat sink respectively.

7 Claims, 4 Drawing Sheets

HEAT SINK AND HEAT SPREADER ASSEMBLY

FIELD OF INVENTION

This invention relates to a heat sink assembly and a heat spreader assembly for the removal of heat from microelectronic components such as a computer cpu, gpu and other semiconductor devices.

BACKGROUND OF THE INVENTION

The demand for miniaturization of electronic components and electronic devices has significantly increased heat flux requirements to maintain the temperature of the components at low enough levels to prevent their failure. To effectuate the removal of heat from an electronic component and/or electronic device it is conventional to attach a heat dissipating apparatus, e.g., a heat sink and/or a heat pipe module, to a surface of the component or electronic device and/or to affix a heat spreader to the heat source. A conventional heat sink consists of a conductive base member for removing heat from the electronic component by thermal heat conduction and appropriate hardware to effectuate the transfer of heat removed by conduction into the atmosphere typically by means of convection and radiation. The hardware for transferring heat typically employs fins and may include a fan to improve heat transfer by convection.

A heat spreader is a heat dissipating conductive member which may be used in combination with a heat sink for removing heat from an electronic component and/or electronic device.

Further improvements to heat transfer have been achieved by the use of a compliant interface material of high thermal conductivity placed between the heat source and heat sink to accommodate for imperfections and gaps which invariably are present between these surfaces. However, these improvements are not, of themselves, sufficient to satisfy the present and future heat flux requirements of miniaturized microelectronic components. Although heat transfer can be yet further increased by application of high pressure between the heat sink hardware and the heat source the application of high pressure is detrimental in that it causes undesirable stresses.

SUMMARY OF INVENTION

A heat sink and heat spreader assembly have been designed in accordance with the present invention to substantially reduce contact resistance between the base member of a heat sink and heat source and/or between a heat spreader and heat sink.

The heat sink assembly of the present invention comprises: a solid conductive base member and a layer of low melting alloy having phase change properties bonded to at least one surface of the solid conducting base member such that a welded joint is formed there between possessing a thickness of from 0.0001 to 0.020 inches and having a composition consisting essentially of said low melting alloy with the welded joint being suitable for direct attachment to an electronic heat source. In the preferred arrangement the welded joint protrudes from the base member of the heat sink and forms a relatively flat surface for attachment to an electronic heat source. The heat sink assembly may further include a sealing material or o-ring for placement over the welded joint so as to form a dam for isolating the welded joint from the atmosphere upon its attachment to an electronic heat source and for confining the metal alloy from spreading outside of the dam after being heated at or above the melting temperature of the low melting alloy.

The heat spreader assembly of the present invention comprises a solid conductive member having two opposed relatively flat surfaces and a layer of low melting alloy having phase change properties bonded to one of said relatively flat surfaces such that a welded joint is formed there between possessing a thickness of from 0.0001 to 0.020 inches and having a composition consisting essentially of said low melting alloy with the welded joint formed on the surface of the heat spreader to form a surface suitable for direct attachment to a heat sink.

BRIEF DESCRIPTION OF THE DRAWINGS

Other advantages of the present invention will become apparent from the following detailed description of the invention when read in conjunction with the accompanying drawings of which.

DETAILED DESCRIPTION OF THE DRAWINGS

Figure 1:
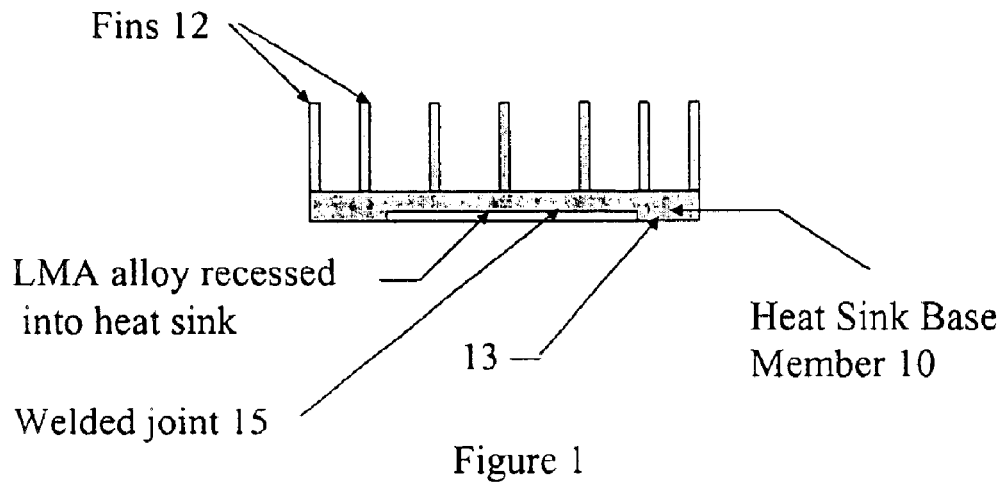
FIG. 1 is a cross sectional view of a heat sink assembly with a welded joint of LMA alloy formed on one surface in accordance with the present invention.
Figure 2:
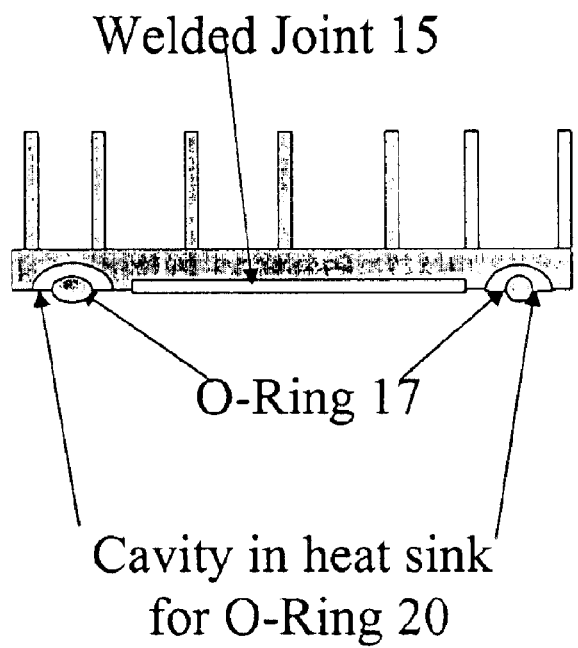
FIG. 2 is a cross sectional view of a modified heat sink assembly of FIG. 1 incorporating an o-ring for isolating the welded joint of LMA alloy when attached to a cpu.
Figure 3:
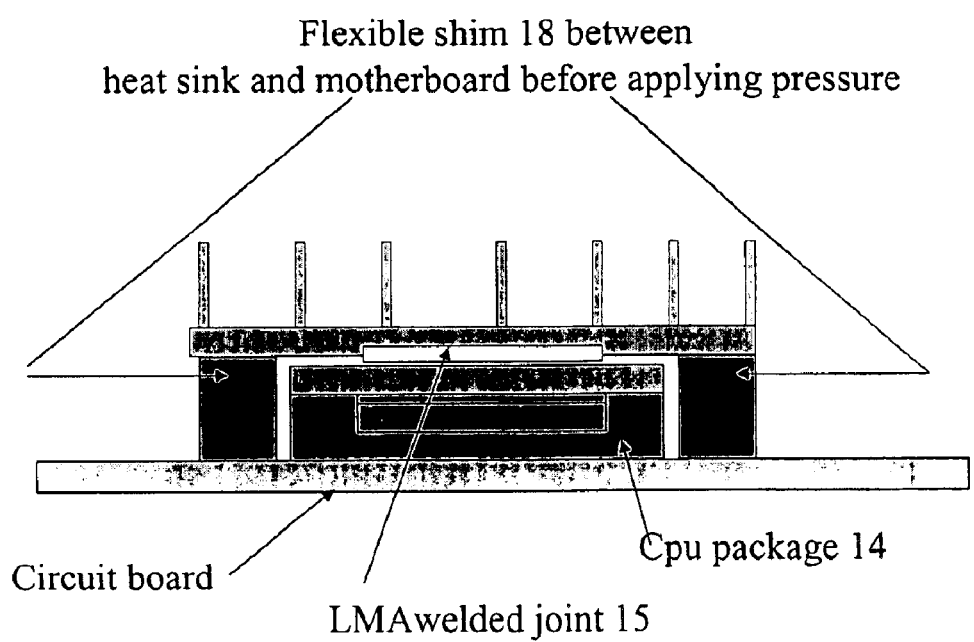
FIG. 3 is a cross sectional view of a further embodiment of the heat sink assembly of the present invention shown attached to a cpu package in combination with a flexible shim for isolating the welded joint of LMA alloy.

The heat sink assembly of the present invention is shown in FIGS. 1–3 comprising a base member 10 composed of a solid body of a highly conductive material which can be metallic or non-metallic preferably a metal such as copper or aluminum and a plurality of fins 12 extending therefrom. The solid base member 10 has a relatively flat planar surface 13 which is adapted to be attached to an external surface of a microelectronic component or cpu package 14 using conventional fastening means (not shown) such as spring clips to secure the base member 10 to the cpu package 14.

A low melting alloy (hereinafter "LMA alloy") is bonded to the planar surface 13 of the solid base member 10 at an elevated temperature sufficient to form a welded joint 15 as is shown in FIGS. 1–3 which may be flush with the surface 13 of the base member 10 or may protrude therefrom or be recessed into the base member 10. The welded joint 15 should constitute a body consisting essentially of the LMA alloy composition and possess a thickness of from 0.0001 to 0.020 inches and should have an exposed smooth relatively flat surface defining a surface area which is preferably smaller than the surface area of the external surface of the microelectronic component, heat spreader, or cpu 14 to which it is to be attached. It is important that the welded joint 15 represent as thin a layer of the LMA alloy as is practical from a manufacturing and cost standpoint since the thermal resistance of the LMA layer is proportional to its thickness.

The LMA alloy should consist of a material composition having phase change properties characterized by a viscosity which is responsive to temperature such that the LMA alloy material will be solid at room temperature but will soften i.e., begin to melt as the temperature rises above room temperature. For purposes of the present invention, the LMA alloy composition should have a melting temperature of less than 157° C. The preferred LMA alloy of the present invention should be a material composition selected from the group of elements consisting of indium, bismuth, tin, lead, cadmium, gallium, zinc, silver and combinations thereof. An optimum LMA alloy composition of the present invention comprises at least between 10 wt %–80 wt % indium and 20 wt %–50 wt % bismuth with the remainder, if any, selected from the above identified group of elements. An example of one suitable LMA alloy composition would comprise indium at 51 wt %, tin at 16.5 wt % and bismuth of about 32.5 wt %. This composition melts at approximately 61° C.

After bonding the LMA composition to the flat surface 13 of base 10 of the heat sink to form the welded joint 15, the welded joint may be abutted against an external surface of a cpu package 14. When the cpu package is operational it will rise to a temperature above room temperature. When the temperature reaches the melting point of the LMA alloy, the welded joint 15 will begin to flow or spread out from in-between the joint to cover a much larger surface area, i.e., an oversized area extending outside the perimeter of the thermal joint. This permits the heat source and heat sink to move closer to one another, leaving behind just enough LMA to fill any gaps or imperfections and to form a very thin interface with exceptionally low interfacial barrier thermal resistance.

A low melting alloy composition may be susceptible to oxidation over time unless air is excluded. Oxidation of the LMA alloy reduces its thermal conductivity and diminishes its thermal performance. This possibility can be minimized by having the LMA material in the oversized area extending outside the perimeter of the thermal joint form a "dam". A dam may automatically be formed when excess alloy is squeezed out between the opposing surfaces provided it sticks to the base member 10 of the heat sink around the perimeter of the cpu package 14. A dam functions to prevent air (oxygen) from getting to the interfacial area.

To assure that the LMA alloy is present in an area extending beyond the perimeter of the welded joint 15 the base member 10 should be treated with cleaning oxides to remove dirt or any film that may be present before or during the welding process or by fluxing the area with a conventional solder flux.

A physical barrier may likewise be formed around the welded thermal joint 15 to prevent the ingress of air from the atmosphere which may otherwise promote oxidation. The barrier must be effective at high temperature at least equal to the melting point of the LMA. A seal forming a physical barrier can be accomplished in many ways preferably by modifying the base member 10 of the heat sink as shown in FIG. 2 to form an annular groove 16 around the circumference of the welded joint 15 to accommodate placement of a soft rubber O-ring 17. Alternatively the soft rubber O-ring 17 may be used without forming a groove 16 or a flexible insulating shim 18 may be used as shown in FIG. 3 placed between the base member 10 of the heat sink and the cpu package 14. The flexible insulating shim 18 should surround the welded joint 15. It should be pointed out that the seal formed between the heat sink and heat source does not necessarily have to be completely hermetic. Any sealing material which will not readily transmit air or oxygen through the seal is acceptable, even if it allows slow diffusion of air or oxygen. In the latter case, the rate of oxidation of the welded thermal joint will still be significantly slowed down.

The O-ring 17 design can be optimized by an O-ring 17 size and composition which allows the O-ring 17 to be squeezed until it is at least as thin as the bond-line of the LMA alloy after squeeze-out, in order to minimize thermal resistance. In this case, the O-ring seals the area between the base member 10 and the opposing surface (which may be the lid) of the cpu package 14. Note that the O-ring groove 20 is wide to accommodate squeezing of the O-ring 17 down to minimize bond-line thickness. The O-ring 17 seals off the space between the mated surfaces of the cpu and the base member 10 of the heat sink assembly.

In the arrangement of FIG. 3 the flexible insulating shim 18 is a soft, pliable, compliant organic material which effectively seals off the cpu package 14 from a continuous supply of fresh air in the atmosphere. The flexible insulating shim 18 can be a pre-formed sealing material or a "form-in-place" sealing material. An example of an acceptable preformed sealing material would be a soft silicone rubber gel such as "Silguard 527" a trademark product of the Dow Corning Corporation. In addition to preventing oxidation, the O-ring 17 or soft compliant sealant 18 serves to prevent any of the squeezed-out alloy from becoming dislodged from the thermal joint and from moving to other areas of the electronic system where it could cause electrical short circuits.

Figure 4:
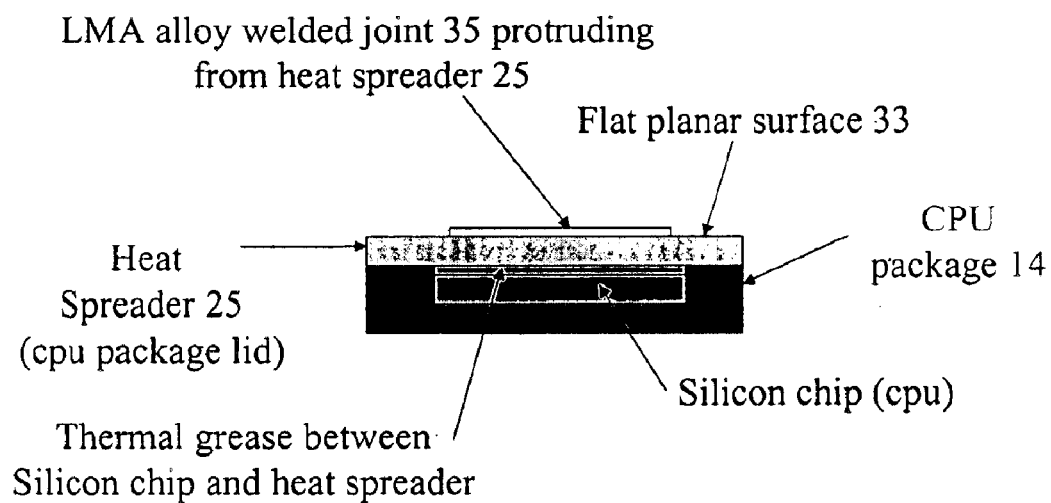
FIG. 4 is a cross sectional view of a heat spreader having a welded joint of LMA alloy formed on one surface in accordance with the present invention shown attached to a cpu package.
Figure 5:
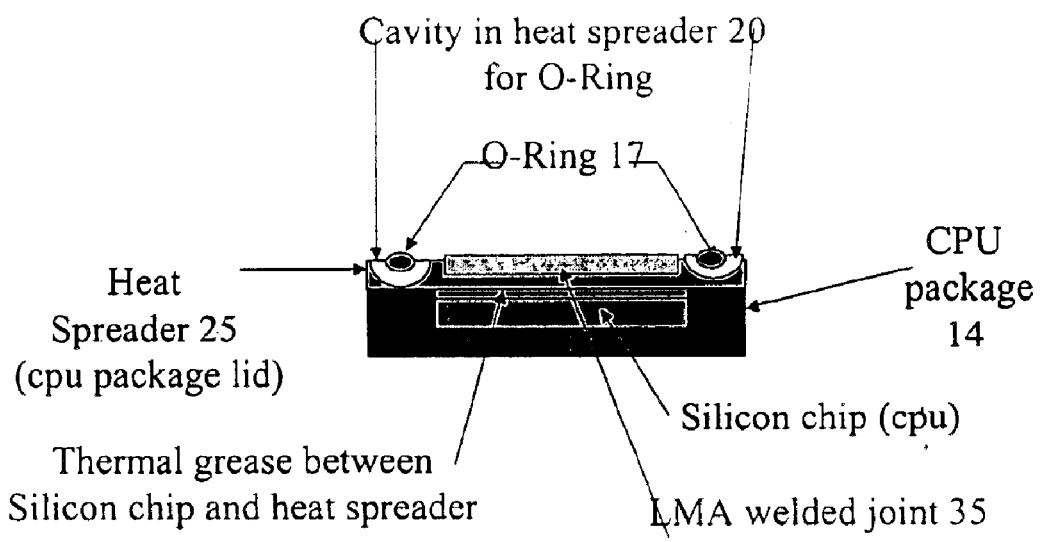
FIG. 5 is a cross sectional view of the heat spreader shown in FIG. 4 modified to receive an optional o-ring for isolating the welded joint of LMA alloy when attached to a heat sink.

A heat spreader 25 as shown in FIGS. 4 and 5 may be used in place of or in combination with the heat sink assembly of FIGS. 1–3. The heat spreader 25 composed of a solid body of a highly conductive material preferably copper or aluminum having a relatively flat planar surface 33. An LMA alloy is bonded to the planar surface 33 to form a welded joint 35 which may be flush with the surface 33 or may protrude therefrom or be recessed therein. The welded joint 35 should consist essentially of the LMA alloy composition and possess a thickness of from 0.0001 to 0.020 inches. The welded joint should form an exposed relatively flat surface adapted to be attached to the base of a heat sink.

Demonstration of the effectiveness of the use of the heat sink assembly and/or the heat spreader of the present invention is indicated in the following table 1.

Table 1 as shown below identifies the thermal resistance for five different heat sink designs (first column) for purpose of comparison with the heat sink assembly of the present invention (as identified in the fourth column) relative to the thermal resistance of a LMA alloy (third column) used simply as a phase change material foil insert for placement between a conventional heat sink and heat source and the thermal resistance of a three layered phase change material (second column) formed with an LMA alloy on the outside surfaces of a copper core. The relative thermal resistance was determined by placing a constant power heat source adjacent and opposed to a particular heat sink design, for each of the 3 types of thermal joints in the second to fourth columns respectively.

Temperature at the surface of the heat source and heat sink was measured, and thermal resistance calculated from the temperature differential and power with the heat sink assembly of the present invention having a thermal resistance substantially lower by a factor of 10 to the thermal resistance of the other three heat sink designs.

TABLE 1

| Heat sink design Reference number | Thermal resistance of an LMA layered structure ° C. in$^2$/W | Thermal Resistance of an LMA alloy foil ° C. in$^2$/W | Thermal resistance of a welded thermal joint ° C. in$^2$/W in a heat sink assembly |
|---|---|---|---|
| 1 | 0.019 | 0.013 | 0.006 |
| 2 | 0.021 | 0.009 | 0.007 |
| 3 | 0.021 | 0.015 | 0.007 |
| 4 | 0.018 | 0.009 | 0.008 |
| 5 | 0.018 | 0.011 | 0.008 |

What is claimed is:

1. A heat sink assembly comprising: a solid base member of a conductive material and a layer of low melting alloy having phase change properties bonded to at least one surface of the solid base member such that a welded joint is formed there between possessing a thickness of from 0.0001 to 0.020 inches and having a composition consisting essentially of said low melting alloy with the welded joint having an exposed relatively flat surface suitable for direct attachment to an electronic heat source.

2. A heat sink assembly as set forth in claim 1 further comprising means for forming a seal to exclude air from the welded joint.

3. A heat sink assembly as set forth in claim 2 wherein said means for forming a seal comprises a sealing material selected form the group consisting of an o-ring or a flexible shim of a soft, pliable, compliant material of organic composition.

4. A heat sink assembly as set forth in claim 2 wherein said heat sink base member includes an annular groove surrounding the periphery of said welded joint to accommodate said means for forming a seal.

5. A heat spreader assembly comprising a solid member of a conductive material having two opposed relatively flat surfaces and a layer of low melting alloy having phase change properties bonded to at least one of said flat surfaces such that a welded joint is formed there between possessing a thickness of from 0.0001 to 0.020 inches and having a composition consisting essentially of said low melting alloy with the welded joint having an exposed relatively flat surface suitable for direct attachment to a heat sink.

6. A heat spreader assembly as set forth in claim 5 further comprising means for forming a seal to exclude air from the welded joint.

7. A heat spreader assembly as set forth in claim 6 wherein said solid member includes an annular groove surrounding the periphery of said welded joint to accommodate said means for forming a seal.

* * * * *